(12) United States Patent
Yu et al.

(10) Patent No.: US 7,903,459 B2
(45) Date of Patent: Mar. 8, 2011

(54) MEMORY DEVICES AND METHODS FOR DETERMINING DATA OF BIT LAYERS BASED ON DETECTED ERROR BITS

(75) Inventors: Donghun Yu, Seoul (KR); Kyoung Lae Cho, Yongin-si (KR); Dongku Kang, Yongin-si (KR); Dong Hyuk Chae, Seoul (KR); Jun Jin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 145 days.

(21) Appl. No.: 12/232,150

(22) Filed: Sep. 11, 2008

(65) Prior Publication Data

US 2009/0231914 A1    Sep. 17, 2009

(30) Foreign Application Priority Data

Mar. 17, 2008    (KR) ................ 10-2008-0024414

(51) Int. Cl.
 *G11C 16/04*    (2006.01)
(52) U.S. Cl. ............ 365/185.03; 365/185.09; 365/185.24
(58) Field of Classification Search ............. 365/185.03, 365/185.09, 185.24
See application file for complete search history.

(56) References Cited

U.S. PATENT DOCUMENTS

| | | | |
|---|---|---|---|
| 4,335,459 A | 6/1982 | Miller | |
| 5,907,504 A | 5/1999 | Hayashi | |
| 6,233,717 B1 | 5/2001 | Choi | |
| 6,598,197 B1 | 7/2003 | Peterson et al. | |
| 7,170,781 B2 * | 1/2007 | So et al. | 365/185.03 |
| 7,193,896 B2 | 3/2007 | Shiga | |
| 2005/0024943 A1 * | 2/2005 | Chen et al. | 365/185.22 |
| 2009/0207659 A1 * | 8/2009 | Song et al. | 365/185.03 |

FOREIGN PATENT DOCUMENTS

| | | |
|---|---|---|
| KR | 10-1999-0077597 | 10/1999 |
| KR | 10-2003-0096307 | 12/2003 |
| KR | 10-2006-0064856 | 6/2006 |
| KR | 10-2006-0112413 | 11/2006 |

OTHER PUBLICATIONS

Internation Search Report and Written Opinion dated Dec. 29, 2008.

* cited by examiner

*Primary Examiner* — Hoai V Ho
(74) *Attorney, Agent, or Firm* — Harness, Dickey & Pierce, P.L.C.

(57) ABSTRACT

Disclosed are a memory device and a memory data reading method. The memory device may include a multi-bit cell array, a threshold voltage detecting unit configured to detect first threshold voltage intervals including threshold voltages of multi-bit cells of the multi-bit cell array from among a plurality of threshold voltage intervals, a determination unit configured to determine data of a first bit layer based on the detected first threshold voltage intervals, and an error detection unit configured to detect an error bit of the data of the first bit layer. In this instance, the determination unit may determine data of a second bit layer using a second threshold voltage interval having a value of the first bit layer different from the detected error bit and being nearest to a threshold voltage of a multi-bit cell corresponding to the detected error bit.

15 Claims, 8 Drawing Sheets

MEMORY DEVICES AND METHODS FOR DETERMINING DATA OF BIT LAYERS BASED ON DETECTED ERROR BITS

PRIORITY STATEMENT

This application claims priority under 35 U.S.C. §119 to Korean Patent Application No. 10-2008-0024414, filed on Mar. 17, 2008, in the Korean Intellectual Property Office (KIPO), the entire contents of which are incorporated herein by reference.

BACKGROUND

Description of Related Art

Example embodiments relate to a method for reading data in a memory device, and more particularly, to a method and device for reading data in a Multi-Level Cell (MLC) or Multi-Bit Cell (MBC) memory device.

A Single-Level Cell (SLC) memory may be a memory for storing one-bit data in a single memory cell. The SLC memory may be also referred to as a Single-Bit Cell (SBC). Data may be stored in an SLC memory cell may through a programming process which can change a threshold voltage of the memory cell. For example, when data of logic '1' is stored in the SLC, the SLC may have a threshold voltage of 1.0 Volt, and when data of logic '0' is stored in the SLC, the SLC may have a threshold voltage of 3.0 Volt.

A threshold voltage generated in each of the SLCs in which identical data is programmed may have a distribution with a certain range due to a slight difference in electric characteristics between the SLCs. For example, when a voltage read from the memory cell is 0.5 to 1.5 Volt, data stored in the memory cell may be determined as the logic '1', and when another voltage read from the memory cell is 2.5 to 3.5 Volt, the data stored in the memory cell may be determined as the logic '0'. The data stored in the memory cell may be divided by difference in current/voltage of the memory cell when performing a reading operation.

In response to a request for high integration of memory, a Multi-Level Cell (MLC) memory in which data of two-bits or more may be programmed in a single memory cell has been suggested. The MLC memory may be referred to as a Multi-Bit Cell (MBC). However, as a number of bits programmed in the single memory cell increases, reliability may deteriorate, and a read failure rate may increase. In order to program m bits in the single memory cell, any one of $2^m$ threshold voltages may be generated in the memory cell. Threshold voltages of the memory cells in which identical data is programmed may generate a distribution with a certain range due to a slight difference in electric characteristics between the memory cells. In this instance, a distribution of the threshold voltage may correspond to each of $2^m$ numbered data capable of being generated by m bits.

However, since a voltage window of the memory may be restricted, a distance between $2^m$ distributions of a threshold voltage between adjacent bits may be reduced along with an increase in 'm'. Also, when the distance between the $2^m$ distributions may be significantly reduced, the distributions may become overlapped. When the distributions are overlapped, the read failure rate may increase. As use of the MLC memory increases, Error Control Codes, Error Control Coding or Error Correction Codes (ECC) may be used for detecting errors generated when storing and reading data and correcting the detected errors.

SUMMARY

Example embodiments provide a memory device and a memory data reading method, which may apply a new multi-level (multi-bit) reading scheme in a multi-level cell memory, thereby reducing a time required for reading data.

Example embodiments provide a memory device and a memory data reading method, which may reduce complexity of hardware used for determining data read from a multi-level cell memory.

Example embodiments provide a memory device and a memory data reading method, which may apply an identical read algorithm to data pages of a multi-level cell memory.

Example embodiments provide a memory device and a memory data reading method, which may reduce requirements of an Error Control Codes, Error Control Coding, or Error correction codes (ECC) required for a multi-level cell memory device, thereby increasing read performance.

Example embodiments provide a memory device and a memory data reading method, which may read data from a multi-level cell memory without performing an additional reading operation.

Example embodiments provide a memory device which may include: a multi-bit cell array; a threshold voltage detecting unit which may be configured to detect first threshold voltage intervals including threshold voltages of multi-bit cells of the multi-bit cell array from among a plurality of threshold voltage intervals; a determination unit which may be configured to determine data of a first bit layer based on the detected first threshold voltage intervals; and an error detection unit which may be configured to detect an error bit of the data of the first bit layer. According to example embodiments, the determination unit may determine data of a second bit layer using a second threshold voltage interval having a value of the first bit layer different from the detected error bit and being nearest to a threshold voltage of a multi-bit cell corresponding to the detected error bit.

Example embodiments provide a memory device which may include: a multi-bit cell array; a control unit which may be configured to set a plurality of program verification voltages such that odd numbers of consecutive program verification voltages from among the plurality of program verification voltages have asymmetrical values of the first bit layer, and assign a value of a second bit layer to each of the plurality of program verification voltages; and a programming unit which may be configured to select one of the plurality of program verification voltages according to the values of the first and the second bit layers stored in each of multi-bit cells of the multi-bit cell array.

Example embodiments provide a data reading method which may include: detecting first threshold voltage intervals including threshold voltages of multi-bit cells from among a plurality of threshold voltage intervals; determining data of a first bit layer based on the detected first threshold voltage intervals; detecting an error bit of the determined data of the first bit layer; selecting a second threshold voltage interval having a value of the first bit layer different from the detected error bit, and being nearest to a threshold voltage of a multi-bit cell corresponding to the detected error bit; and determining data of a second bit layer using the selected second threshold voltage interval.

Example embodiments provide a multi-bit programming method which may include: setting a plurality of program verification voltages such that odd numbers of consecutive program verification voltages from among the plurality of program verification voltages have asymmetrical values of a first bit layer; assigning a value of a second bit layer to each of the plurality of program verification voltages; selecting one of the plurality of program verification voltages according to the values of the first and second bit layers stored in each of multi-bit cells; and changing a threshold voltage of each of the multi-bit cells using the selected program verification voltage.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
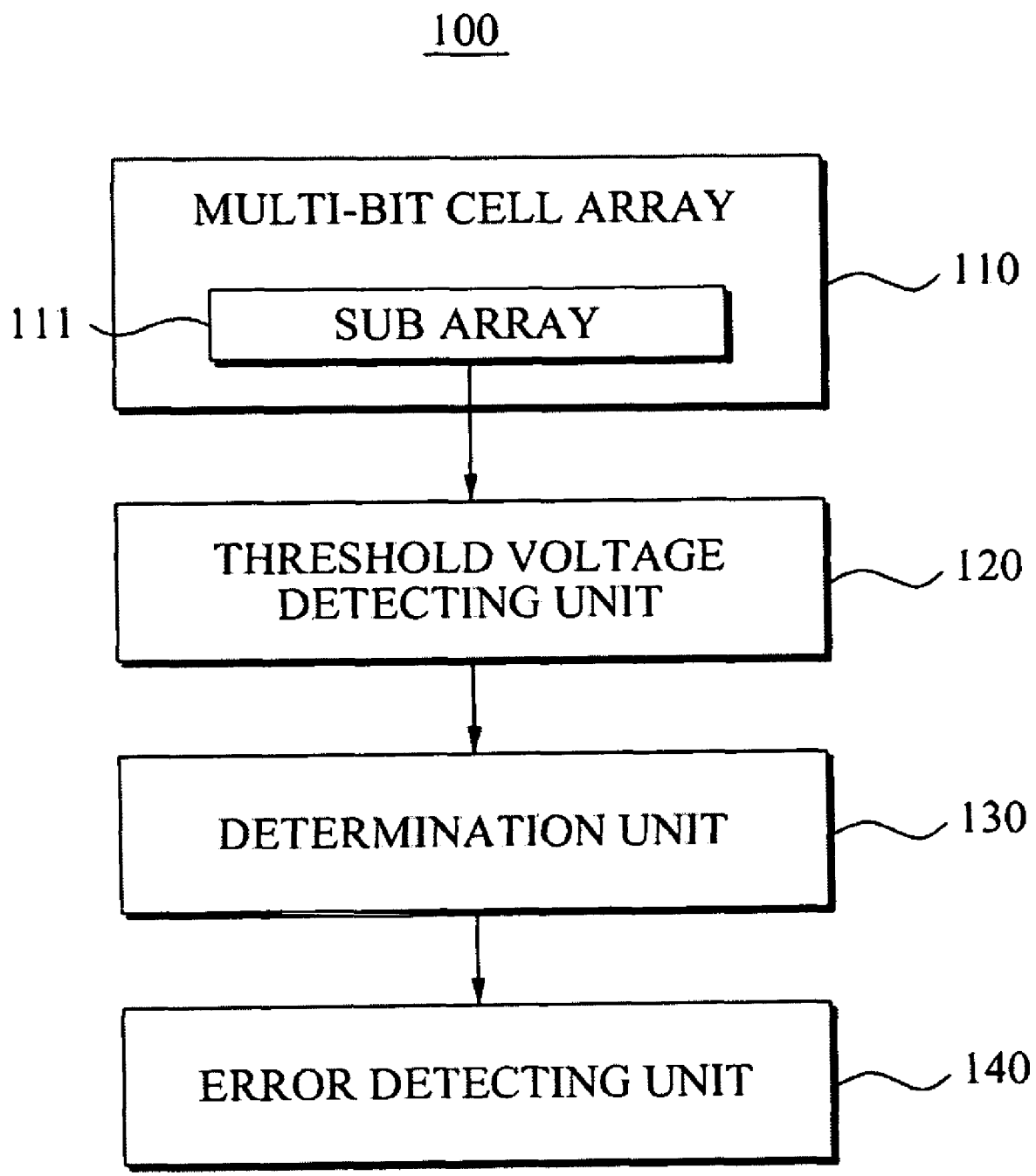
FIG. 1 is a diagram illustrating a memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made in detail to example embodiments illustrated in the accompanying drawings, wherein like reference numerals refer to the like elements throughout. Example embodiments are described below and explained by referring to the figures. In some instances, well-known features are omitted to prevent cumbersome descriptions of example embodiments.

FIG. 1 is a diagram illustrating a memory device 100 according to example embodiments.

Referring to FIG. 1, the memory device 100 may include a multi-bit cell array 110, a threshold voltage detecting unit 120, a determination unit 130, and an error detecting unit 140.

The multi-bit cell array 110 may include a plurality of multi-bit cells. A sub-array 111, which may be included in the multi-bit cell array 110, may be a collection of multi-bit cells being simultaneously accessed by the threshold voltage detecting unit 120. The threshold voltage detecting unit 120 may simultaneously detect first threshold voltage intervals including threshold voltages of multi-bit cells within the sub-array 111.

According to example embodiments, the sub-array 111 may be a collection of memory cells connected to a single word line. The memory device 100 may apply a specific voltage to a word line connected with the sub-array 111, thereby simultaneously reading data from the memory cells within the sub-array 111. According to example embodiments, a collection of the memory cells connected to the single word line may be referred to as a memory page.

Each of the plurality of threshold voltage intervals may represent a value of data stored in the multi-bit cells. When a single multi-bit cell stores m-bit data, $2^m$ threshold voltage intervals may be used to represent the m-bit data.

The threshold voltage detecting unit 120 may identify the first threshold voltage intervals including threshold voltages of each of the multi-bit cells within the sub-array 111. A threshold voltage of a single multi-bit cell may be included in one of the first threshold voltage intervals.

The determination unit 130 may determine data of a first bit layer based on the detected first threshold voltage intervals. The determination unit 130 may determine data of the first bit layer of each of the multi-bit cells within the sub-array 111. A bit layer may be the bits in a particular bit position for each of a plurality of multi-bit cells. For example, the first bit layer may comprise the least significant bits of each of the multi bit cells in the sub-array 111.

Data forming a bit layer may designate data forming a page. According to example embodiments, the collection of the multi-bit cells connected to the single word line may designate a memory page, and data stored in the multi-bit cells of the single memory page and forming a single bit layer may designate a data page. These designations are used merely for convenience and clarity of the descriptions, and are not intended to limit the scope of example embodiments. When each of the multi-bit cells may store m-bit data, m numbered data pages may be stored in a single memory page.

Figure 2:
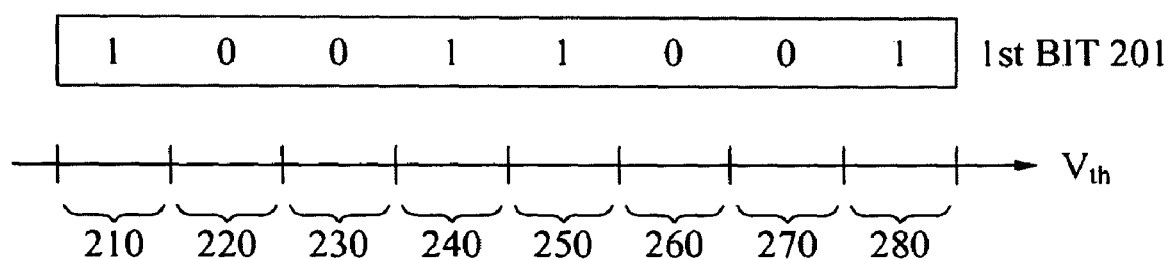
FIG. 2 is a diagram illustrating an example of an operation for determining data of a first bit layer by a determination unit of FIG. 1.

FIG. 2 is a diagram illustrating an example of an operation for determining data of a first bit layer by a determination unit 130 of FIG. 1.

Referring to FIG. 2, the determination unit 130 may determine data of a first bit layer using eight threshold voltage intervals 210 to 280. A row 201 may designate values of the first bit layer which the eight threshold voltage intervals 210 to 280 have.

The threshold voltage interval 210 may have the value of '1' in the first bit layer. A multi-bit cell having a threshold voltage included in the threshold voltage interval 210 may be determined to store data having the value of '1' in the first bit layer by the determination unit 130.

The threshold voltage interval 220 may have the value of '0' in the first bit layer. A multi-bit cell having a threshold voltage included in the threshold voltage interval 220 may be determined to store data having the value of '0' in the first bit layer by the determination unit 130.

Each of the threshold voltage intervals 240, 250, and 280 may have the value of '1' in the first bit layer. A multi-bit cell having threshold voltages included in the threshold voltage intervals 240, 250, and 280 may be determined to store data having the value of '1' in the first bit layer by the determination unit 130.

Each of the threshold voltage intervals 230, 260, and 270 may have the value of '0' in the first bit layer. A multi-bit cell having threshold voltages included in the threshold voltage intervals 230, 260, and 270 may be determined to store data having the value of '0' in the first bit layer by the determination unit 130.

The eight threshold voltage intervals 210 to 280 of FIG. 2 may be set such that odd numbers of consecutive threshold voltage intervals have asymmetrical values of the first bit layer. For example, referring to the example in FIG. 2, three consecutive threshold voltage intervals 210, 220, and 230 have '1', '0', and '0' of values of the first bit layer, respectively. On the contrary, as an example, symmetrical values of the first bit layer may be '1', '0', and '1', and the like. Referring again to the example in FIG. 2, another three consecutive threshold voltage intervals 230, 240 and 250 have '0', '1' and '1' of asymmetrical values of the first bit layer, respectively.

Referring again to FIGS. 1 and 2, the error detecting unit 140 may detect an error bit of the determined data of the first bit layer. A process where the error detecting unit 140 detects an error bit may be a process for ECC (Error Control Codes, Error Control Coding, or Error Correction Codes) decoding the determined data of the first bit layer.

The determination unit 130 may determine data of a second bit layer using a second threshold voltage interval having a value of the first bit layer different from the detected error bit and being nearest to a threshold voltage of a multi-bit cell corresponding to the detected error bit.

When a threshold voltage of a specific multi-bit cell is included in the threshold voltage interval 250, data of the first bit layer of the specific multi-bit cell may be determined to be '1'. The error detecting unit 140 may ECC decode the determined data of the first bit layer based on the multi-bit cells of the sub-array 111 and the first threshold voltage intervals. The error detecting unit 140 may ECC decode data of the first bit layer to thereby detect an error bit of the data of the first bit layer. When the data of the first bit layer of the specific multi-bit cell is detected as an error bit, correct data of the first bit layer of the specific multi-bit cell may be '0', which is different from '1'. The determination unit 130 may search for the threshold voltage interval having the value of '0' in the first bit layer that is nearest to the threshold voltage of the specific multi-bit cell, threshold voltage interval 260. The determination unit 130 may regard the threshold voltage of the specific multi-bit cell as the threshold voltage interval 260 at the time of storing data. The determination unit 130 may determine data of the second bit layer of the specific multi-bit cell according to values of a second bit layer of the threshold voltage interval 260.

The first threshold voltage interval of the specific multi-bit cell may be the threshold voltage interval 250, and the second threshold voltage interval thereof may be the threshold voltage interval 260. Conversely, when data of the specific multi-bit cell does not have errors, the determination unit 130 may determine data of the second bit layer of the specific multi-bit cell using the first threshold voltage interval.

The threshold voltage intervals 240 and 260 of the vicinity of the threshold voltage interval 250, may have asymmetrical values in the first bit layer, and thus may have values different from each other in the first bit layer. When the data of the first bit layer of the specific multi-bit cell is detected as an error, the determination unit 130 may select either the threshold voltage interval 240 or the threshold voltage interval 260 as the second threshold voltage interval. The threshold voltage intervals 240 and 260 may have values of the first bit layer being different from each other, and thereby the determination unit 130 may select the second threshold voltage interval, for example the threshold voltage interval having a different value from the threshold voltage interval 250, in any case.

Figure 3:
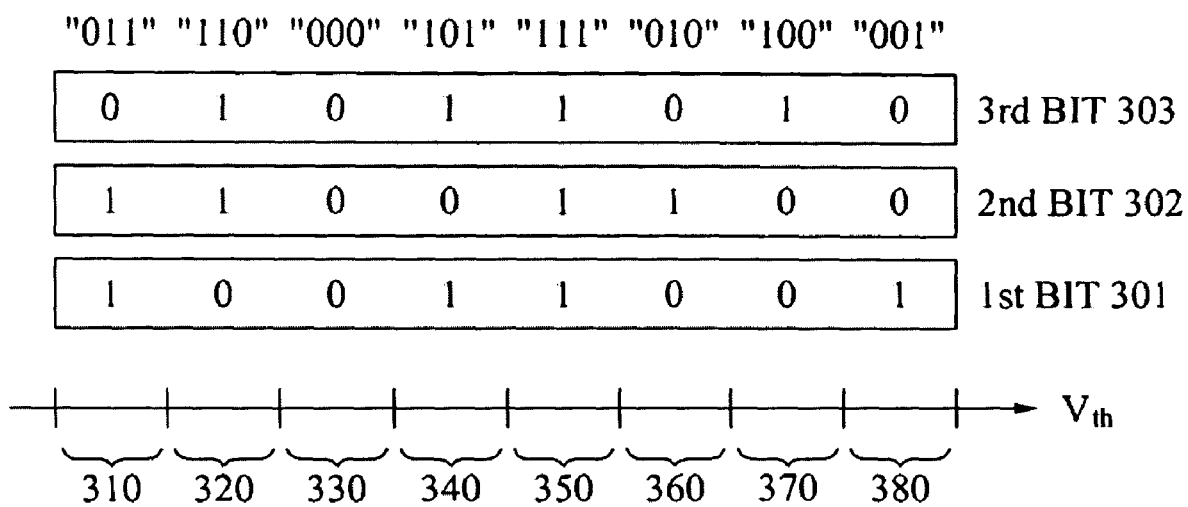
FIG. 3 is a diagram illustrating another example of an operation for determining data of the memory device of FIG. 1.

FIG. 3 is a diagram illustrating another example of an operation for determining data of the memory device 100 of FIG. 1.

Referring to FIG. 3, the memory device 100 may determine data of a first bit layer, a second bit layer, and a third bit layer using eight threshold voltage intervals 310 to 380.

A row 301 may designate values of the first bit layer which eight threshold voltage intervals 310 to 380 have, a row 302 may designate values of the second bit layer which the eight threshold voltage intervals 310 to 380 have, and a row 303 may designate values of the third bit layer which the eight threshold voltage intervals 310 to 380 have.

In the example illustrated in FIG. 3, the threshold voltage intervals 310, 320, 330, and 340 have values of '011', '110', '000', and '101', respectively. In the example illustrated in FIG. 3, the threshold voltage intervals 350, 360, 370, and 380 have values of '111', '010', '100', and '001'.

The threshold voltage detecting unit 120 may detect first threshold voltage intervals including threshold voltages of multi-bit cells. The determination unit 130 may determine data of the first and second bit layers based on the detected first threshold voltage intervals. The error detecting unit 140 may detect an error bit of the data of the determined first and second bit layers. The determination unit 130 may identify a multi-bit cell corresponding to the detected error bit. The determination unit 130 may select a second threshold voltage interval with respect to the identified multi-bit cell. According to example embodiments, the second threshold voltage interval may be the threshold voltage interval, having a value of either the first bit layer or the second bit layer different from the detected error bit, that is nearest to a threshold voltage of the identified multi-bit cell. The determination unit 130 may determine data of the third bit layer of the identified multi-bit cell using the selected second threshold voltage interval.

For example, a threshold voltage of a first multi-bit cell from among multi-bit cells of the sub-array 111 may be detected to correspond to the threshold voltage interval 310. The threshold voltage detecting unit 120 may detect the threshold voltage interval 310 as the first threshold voltage interval of the first multi-bit cell.

The determination unit 130 may determine data of the first and second bit layers of the first multi-bit cell to be '1', respectively, based on the first threshold voltage interval of the first multi-bit cell. When an error is detected in the data of the first bit layer of the first multi-bit cell, the determination unit 130 may select the threshold voltage interval 320 as the second threshold voltage interval of the first multi-bit cell. The determination unit 130 may determine data of the third bit layer of the first multi-bit cell to be '1' based on the value of '1' in the third bit layer of the second threshold voltage interval of the first multi-bit cell, threshold voltage interval 320.

When storing data, a threshold voltage of the multi-bit cell having the threshold voltage included in the threshold voltage interval 320 may be changed to be included in the threshold voltage interval 310 over time which may result in data reading errors. The threshold voltage of the multi-bit cell may be reduced over time as a result of, for example, a charge loss mechanism.

The multi-bit cell may be constructed such that an insulator layer is positioned between a Control Gate (CG) and a Floating Gate (FG) and between the FG and a substance, respectively. The memory device 100 may apply a specific voltage to the CG and the substance of the multi-bit cell, thereby charging an electric charge to the FG or discharging the electric charge from the FG A process where the electric charge is charged to the FG or discharged from the FG may be performed by a mechanism, for example a Fowler-Nordheim Tunneling (F-N tunneling), a hot carrier effect, and the like. The electric charge charged to the FG is required to be maintained in the FG before satisfying a discharge condition. However, when the electric charge charged to the FG is spread out due to a natural diffusion phenomenon, the electric charge within the FG may be reduced, or when an insulator around the FG may be damaged to form a leaking path of the electric charge, the electric charge charged in the FG may be lost.

According to example embodiments, when the data of the first and second bit layers of the first multi-bit cell are detected as errors, the determination unit 130 may select the threshold voltage interval 330 as the second threshold voltage interval of the first multi-bit cell. According to example embodiments, the determination unit 130 may determine data of the third bit layer of the first multi-bit cell to be '0' according to the value of '0' in the third bit layer of the threshold voltage interval 330.

As another example, a threshold voltage of the second multi-bit cell from among the multi-bit cells of the sub-array 111 may be detected to correspond to the threshold voltage interval 320. The threshold voltage detecting unit 120 may detect the threshold voltage interval 320 as the first threshold voltage interval of the second multi-bit cell.

The determination unit 130 may determine data of the first bit layer of the second multi-bit cell to be '0' based on the first threshold voltage interval of the second multi-bit cell, and may also determine data of the second bit layer to be '1' based on the same. When the data of the first bit layer of the second multi-bit cell is detected as errors, the determination unit 130 may select the threshold voltage interval 310 as the second threshold voltage interval of the second multi-bit cell. According to example embodiments, the threshold voltage interval 310 is nearest to the threshold voltage interval 320 and has the value of '1' in the first bit layer. The determination unit 130 may determine data of the third bit layer of the second multi-bit cell to be '0' according to the value of '0' in the third bit layer of the second threshold voltage interval of the second multi-bit cell.

When storing data, a threshold voltage of the multi-bit cell having the threshold voltage included in the threshold voltage interval 310 may be changed to be included in the threshold voltage interval 320 over time. The threshold voltage of the multi-bit cell may be increased over time as a result of, for example, a FG coupling mechanism.

FG coupling may denote a phenomenon in which a threshold voltage of a center multi-bit cell is affected by an amount of change in a threshold voltage of the peripheral multi-bit cells. The threshold voltage of the center multi-bit cell may be affected by a coupling of a parasitic capacitance between FGs of the multi-bit cells.

When, in a process for storing data in a multi-bit cell, a programming process, a threshold voltage of the vicinity of the multi-bit cell may increase, the threshold voltage of the center multi-bit cell may increase to be greater than a target value due to the FG coupling.

A distribution of a threshold voltage of multi-bit cells may be apt to be spread out by a mechanism, for example FG coupling. In general, it is well-known that change in the threshold voltage caused by FG coupling may be relatively greater when the threshold voltage of the center multi-bit cell is relatively low.

When data of the second bit layer of the second multi-bit cell is detected as errors by the error detecting unit 140, the determination unit 130 may select the threshold voltage interval 330 as the second threshold voltage interval of the second multi-bit cell. According to example embodiments, the threshold voltage interval 330 may be the nearest threshold interval to the threshold voltage interval 320 that has the value of '0' in the second bit layer. The determination unit 130 may determine data of the third bit layer of the second multi-bit cell to be '0' based on the value of '0' in the third bit layer of the second threshold voltage interval of the second multi-bit cell, the threshold voltage interval 330. The determination unit 130 may correct errors, which may be caused by the charge loss mechanism of the second multi-bit cell having the threshold voltage interval 320 acting as the first threshold voltage interval, by performing an ECC decoding with respect to the second bit layer, and may correct errors, which may be caused by the FG coupling mechanism of the second multi-bit cell, by ECC decoding the first bit layer.

According to example embodiments, when three consecutive threshold voltage intervals from among eight threshold voltage intervals 310 to 380 are selected, the selected three consecutive threshold voltage intervals may have asymmetrical values of the first bit layer, so that the determination unit 130 may select the second threshold voltage interval having correct values of the first bit layer when the determined data of the first bit layer is detected as an error. Similarly, the selected three consecutive threshold voltage intervals may have asymmetrical values of the second bit layer so that the determination unit 130 may select the second threshold voltage interval having correct values of the second bit layer when the determined data of the second bit layer is detected as an error.

When the determined data of the first bit layer and/or the determined data of the second bit layer are detected as errors, the memory device 100 may select the second threshold voltage interval of the multi-bit cell corresponding to the errors without trial and error. The memory device 100 may select the second threshold voltage interval corresponding to the correct data without trial and error, and may thereby reduce a time required for reading data from the multi-bit cell.

The determination unit 130 may detect errors of the determined data of the first and second bit layers with respect to the specific multi-bit cell, and may thereby select the second threshold voltage interval, that is, a correct threshold voltage interval of the specific multi-bit cell.

According to example embodiments, two threshold voltage intervals adjacent to each other from among the eight threshold voltage intervals 310 to 380 of FIG. 3 may have values different from each other with respect to at least one of the first bit layer and the second bit layer. For example, the threshold voltage intervals 310 and 320 may have values of the first bit layer being different from each other, and the threshold voltage intervals 320 and 330 may have values of the second bit layer being different from each other.

An event transition may designate that two threshold voltage intervals adjacent to each other may have values of the first bit layer, the second bit layer, or the third bit layer, which are different from each other. For example, referring to the example in FIG. 3, a transition of the first bit layer and the third bit layer may be generated between the threshold voltage intervals 310 and 320; and a transition of the second bit layer and the third bit layer may be generated between the threshold voltage intervals 320 and 330.

The memory device 100 may detect a threshold voltage of multi-bit cells using a read voltage between the threshold voltage intervals where the transition is generated. Referring to the example in FIG. 3, the transition may be generated four times with respect to the first bit layer, three times with respect to the second bit layer, and six times with respect to the third bit layer, respectively. The memory device 100 may detect the threshold voltage of the multi-bit cells using at least four read voltage levels in order to determine the data of the first bit layer. The memory device 100 may detect the threshold voltage of the multi-bit cells using at least three read voltage levels in order to determine the data of the second bit layer. Further, the memory device 100 may detect the threshold voltage of the multi-bit cells using at least six read voltage levels in order to determine the data of the third bit layer.

An error occurrence probability for the data determined with respect to each of the bit layers may be related to a number of transitions. According to the example depicted in FIG. 3, the error occurrence probability for the data determined with respect to the third bit layer may be predicted to be higher than that of the data determined with respect to the first bit layer or the second bit layer.

The memory device 100 may determine the data of the third bit layer, which may have a relatively higher error occurrence probability, using the determined result of the first bit layer or the second bit layer, which may each have a relatively lower error occurrence probability, and the ECC decoding result, and may thereby reduce the error occurrence probability of the data of the third bit layer.

The memory device 100 may determine the data of the third bit layer using the ECC decoding result of the data of the first bit layer or the second bit layer without performing an ECC decoding with respect to the data of the third bit layer.

The threshold voltage detecting unit 120 may detect the first threshold voltage intervals, including the threshold voltage of the multi-bit cells, using seven read voltage levels. The threshold voltage detecting unit 120 may apply a voltage concerning each of the read voltage levels to a gate terminal of the multi-bit cells of the sub-array 111, may sense an electric current of each of the multi-bit cells, and may thereby determine whether the threshold voltage of each of the multi-bit cells is higher or lower than each of the read voltage levels.

When three consecutive threshold voltage intervals have asymmetrical values of the first and second bit layers, and two adjacent threshold voltage intervals have either values of the first bit layer different from each other or values of the second bit layer different from each other, the determination unit 130 may detect errors of the data of the first bit layer or the second bit layer even when any one of a FG coupling mechanism (a phenomenon in which a threshold voltage of the multi-bit cell may increase) and a charge loss mechanism (a phenomenon in which the threshold voltage of the multi-bit cell may decrease) may occur, and may thus determine the data of the third bit layer. According to example embodiments, the memory device 100 may determine the data of the third bit layer without performing an ECC decoding with respect to the data of the third bit layer.

According to the ECC decoding result with respect to the data of the first and second bit layers, the first threshold voltage interval of the multi-bit cell where an error is not detected may be regarded as a correct threshold voltage interval. Thus, the memory device 100 may determine the data of the third bit layer using the first threshold voltage interval concerning the multi-bit cell where an error is not detected based on the ECC decoding result with respect to the data of the first and second bit layers.

The memory device 100 may reduce a time required for reading data of the multi-bit cells of the multi-bit cell array 110 without performing the ECC decoding with respect to the data of the third bit layer.

A scheme in which any one of '0' or '1' is assigned to each of the intervals and data is determined using the assigned values may denote a hard decision. The threshold voltage detecting unit 120 may detect threshold voltage intervals including the threshold voltage of the multi-bit cells using seven read voltage levels, and the determination unit 130 may perform a hard decision on the data of the first and second bit layers based on the detected first threshold voltage intervals. The determination unit 130 may perform a hard decision on a part of the data of the third bit layer using the detected errors of the data of the first bit layer or the second bit layer. The determination unit 130 may perform a hard decision on a part of the data of the remaining third bit layer based on the first threshold voltage intervals.

A scheme in which fractional (additional) read voltage levels are set between the read voltage levels and fractionalized threshold voltage intervals are detected using the fractional read voltage levels may designate a fractional read. The memory device 100 may determine data stored in the multi-bit cell even without performing the fractional read, and may thereby reduce a time required for reading the data stored in the multi-bit cell. The memory device 100 may correct errors of the data stored in the multi-bit cell without performing the fractional read.

According to example embodiments, the memory device 100 may determine data of m bit layers using $2^m$ threshold voltage intervals. The memory device 100 may determine data of an m-th bit layer without performing the ECC decoding with respect to the data of the m-th bit layer, thereby reducing ECC requirements. The memory device 100 may reduce the ECC requirements, thereby reducing complexity of hardware.

According to example embodiments, the memory device 100 may determine data of four bit layers using sixteen threshold voltage intervals.

In this instance, the determination unit 130 may determine the data of the first and second bit layers, and the error detecting unit 140 may detect an error bit of the data of the determined first and second bit layers. The determination unit 130 may identify a multi-bit cell corresponding to the detected error bit. The determination unit 130 may select the second threshold voltage interval with respect to the identified multi-bit cell. In this instance, the second threshold voltage interval may be the threshold voltage nearest to a threshold voltage of the identified multi-bit cell that has values of the first bit layer or the second bit layer different from the detected error bit. The determination unit 130 may determine data of the third and fourth bit layers of the identified multi-bit cell using the selected second threshold voltage interval.

According to example embodiments, an identical read algorithm may be applied to all bit layers, and thus, all data pages. According to example embodiments, the identical read algorithm may be applied to all of the data pages, thereby reducing complexity of hardware.

Figure 4:
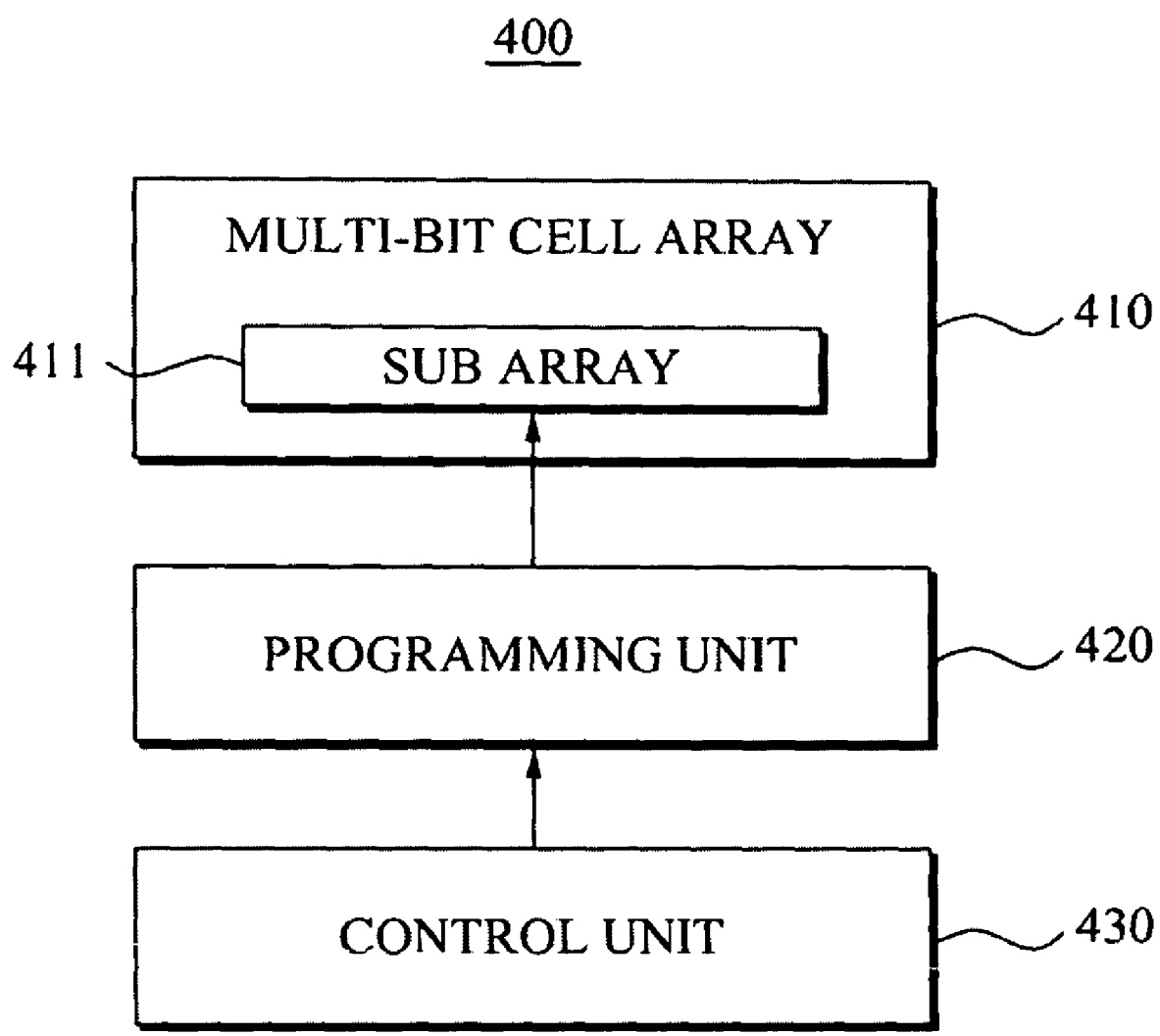
FIG. 4 is a diagram illustrating a memory device according to example embodiments.

FIG. 4 is a diagram illustrating a memory device 400 according to example embodiments.

Referring to FIG. 4, the memory device 400 may include a multi-bit cell array 410, a programming unit 420, and a control unit 430.

The multi-bit cell array 410 may include a plurality of multi-bit cells. The sub-array 411 may be a collection of multi-bit cells where data may be simultaneously programmed. The programming unit 420 may simultaneously program data in the multi-bit cells of the sub-array 411.

The control unit 430 may set a plurality of program verification voltages. Consecutive odd numbers of program verification voltages from among the plurality of program verification voltages may be set to have asymmetrical values of a first bit layer. The control unit 430 may assign values of a second bit layer to each of the set plurality of program verification voltages.

The programming unit 420 may select one of the plurality of program verification voltages according to values of the first and second bit layers stored in each of the multi-bit cells. The programming unit 420 may change a threshold voltage of each of the multi-bit cells of the sub-array 411 using the selected program verification voltage.

The control unit 430 may set the plurality of program verification voltages such that program verification voltages adjacent to each other, from among the plurality of program verification voltages, have values different from each other with respect to at least one of remaining bit layers except the second bit layer.

The programming unit 420 may terminate a program operation with respect to each of the multi-bit cells of the sub-array 411 when the threshold voltage of each of the multi-bit cells of the sub-array 411 is greater than the selected program verification voltage.

Figure 5:
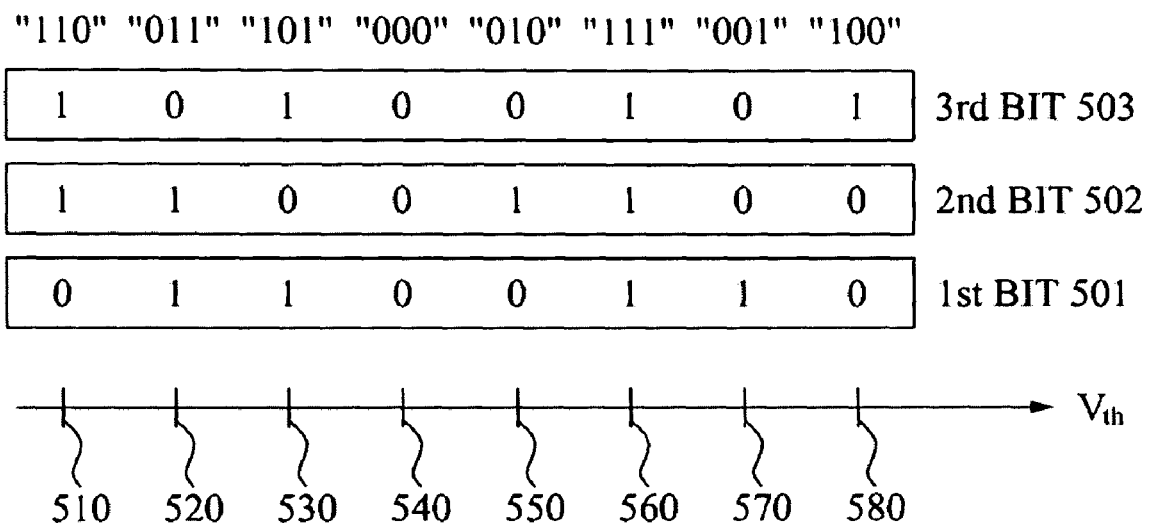
FIG. 5 is a diagram illustrating an example of program verification voltages set by a control unit of FIG. 4.

FIG. 5 is a diagram illustrating an example of program verification voltages set by a control unit 430 of FIG. 4.

Referring to FIG. 5, a 3-bit data is assigned to each of eight program verification voltages 510 to 580.

A row 501 may denote values of a first bit layer assigned to the program verification voltages 510 to 580; a row 502 may denote values of a second bit layer assigned to the program verification voltages 510 to 580; And a row 503 may denote values of a third bit layer assigned to the program verification voltages 510 to 580.

The first program verification voltage may have the value of '0' in the first bit layer, the value of '1' in the second bit layer, and the value of '1' in the third bit layer. Data assigned to the first program verification voltage 510 may designate '110'.

The second program verification voltage may have the value of '1' in the first bit layer, the value of '1' in the second bit layer, and the value of '0' in the third bit layer. Data assigned to the second program verification voltage 520 may designate '011'.

Similarly, data assigned to the third, fourth, fifth, sixth, and eighth program verification voltages 530, 540, 550, 560, 570, and 580 may designate '101', '000', '010', '111', '001' and '100', respectively.

According to example embodiments, three consecutive program verification voltages may have asymmetrical values of the first and second bit layers. For example, the third, fourth, and fifth program verification voltages 530, 540, and 550 may have values of '1', '0', and '0' for the first bit layer, respectively. The third, fourth, and fifth program verification voltages 530, 540, and 550 may have values of '0', '0', and '1' for the second bit layer, respectively.

Adjacent program verification voltages may have values of the first bit layer or the second bit layer that are different from each other. The sixth program verification voltage 560 and the seventh program verification voltage 570 may have values of the second bit layer different from each other, and the fifth program verification voltage 550 and the sixth program verification voltage 560 may have values of the first bit layer different from each other.

Figure 6:
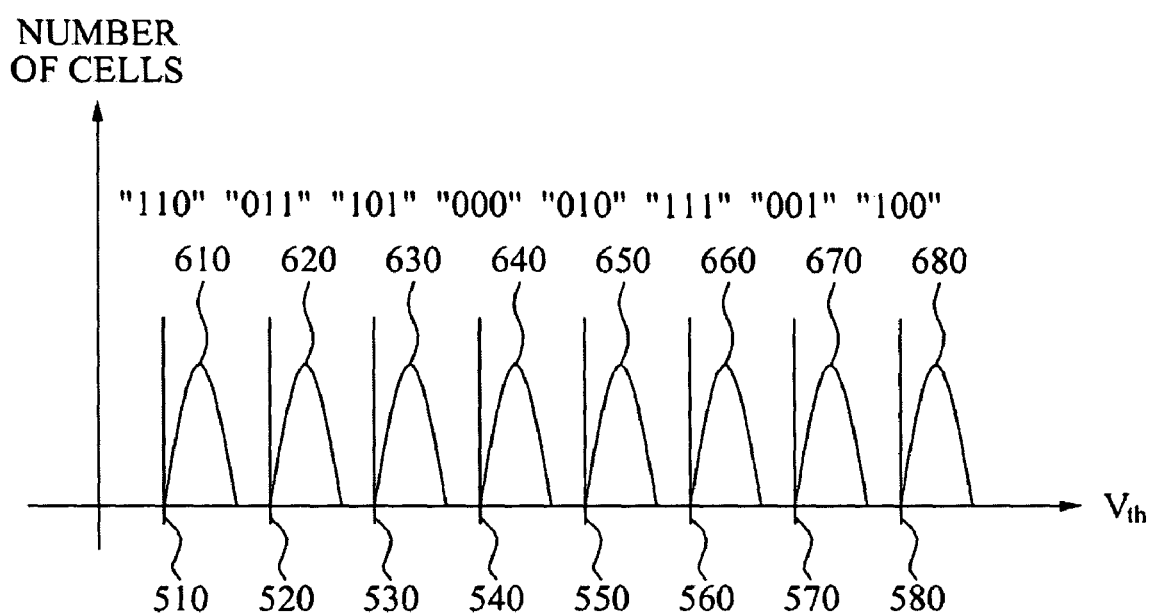
FIG. 6 is a diagram illustrating an example of a distribution of a threshold voltage of multi-bit cells generated by a programming unit of FIG. 4.

FIG. 6 is a diagram illustrating an example of a distribution of a threshold voltage of multi-bit cells generated by a programming unit 420 of FIG. 4.

Referring to FIG. 6, a horizontal axis denotes threshold voltages of multi-bit cells, and a vertical axis denotes a number of multi-bit cells having the corresponding threshold voltage.

The programming unit 420 may change the threshold voltage of the multi-bit cells such that the threshold voltage of the multi-bit cells where data of '110' is stored is greater than the first program verification voltage 510. The threshold voltages of the multi-bit cells where data of '110' is stored may generate a distribution of a certain range due to slight differences in electric characteristics of each of the multi-bit cells. The threshold voltages of the multi-bit cells where data of '110' is stored may generate a first distribution 610.

The programming unit 420 may change the threshold voltage of the multi-bit cells such that the threshold voltage of the multi-bit cells where data of '011' is stored is greater than the second program verification voltage 520. The threshold voltages of the multi-bit cells where data of '011' is stored may generate a second distribution 620.

The programming unit 420 may change the threshold voltage of the multi-bit cells such that the threshold voltage of the multi-bit cells where data of '101' is stored is greater than the third program verification voltage 530. The threshold voltages of the multi-bit cells where data of '101' is stored may generate a third distribution 630.

The programming unit 420 may change the threshold voltage of the multi-bit cells such that the threshold voltage of the multi-bit cells where data of '000' is stored is greater than the fourth program verification voltage 540. The threshold voltages of the multi-bit cells where data of '000' is stored may generate a fourth distribution 640.

The programming unit 420 may change the threshold voltage of the multi-bit cells such that the threshold voltage of the multi-bit cells where data of '010' is stored is greater than the fifth program verification voltage 550. The threshold voltages of the multi-bit cells where data of '010' is stored may generate a fifth distribution 650.

The programming unit 420 may change the threshold voltage of the multi-bit cells such that the threshold voltage of the multi-bit cells where data of '111' is stored is greater than the sixth program verification voltage 560. The threshold voltages of the multi-bit cells where data of '111' is stored may generate a sixth distribution 660.

The programming unit 420 may change the threshold voltage of the multi-bit cells such that the threshold voltage of the multi-bit cells where data of '001' is stored is greater than the seventh program verification voltage 570. The threshold voltages of the multi-bit cells where data of '001' is stored may generate a seventh distribution 670.

The programming unit 420 may change the threshold voltage of the multi-bit cells such that the threshold voltage of the multi-bit cells where data of '100' is stored is greater than the eighth program verification voltage 580. The threshold voltages of the multi-bit cells where data of '100' is stored may generate an eighth distribution 680.

According to example embodiments, data may be regarded as being assigned to each of the distributions instead of each of the program verification voltages.

Figure 7:
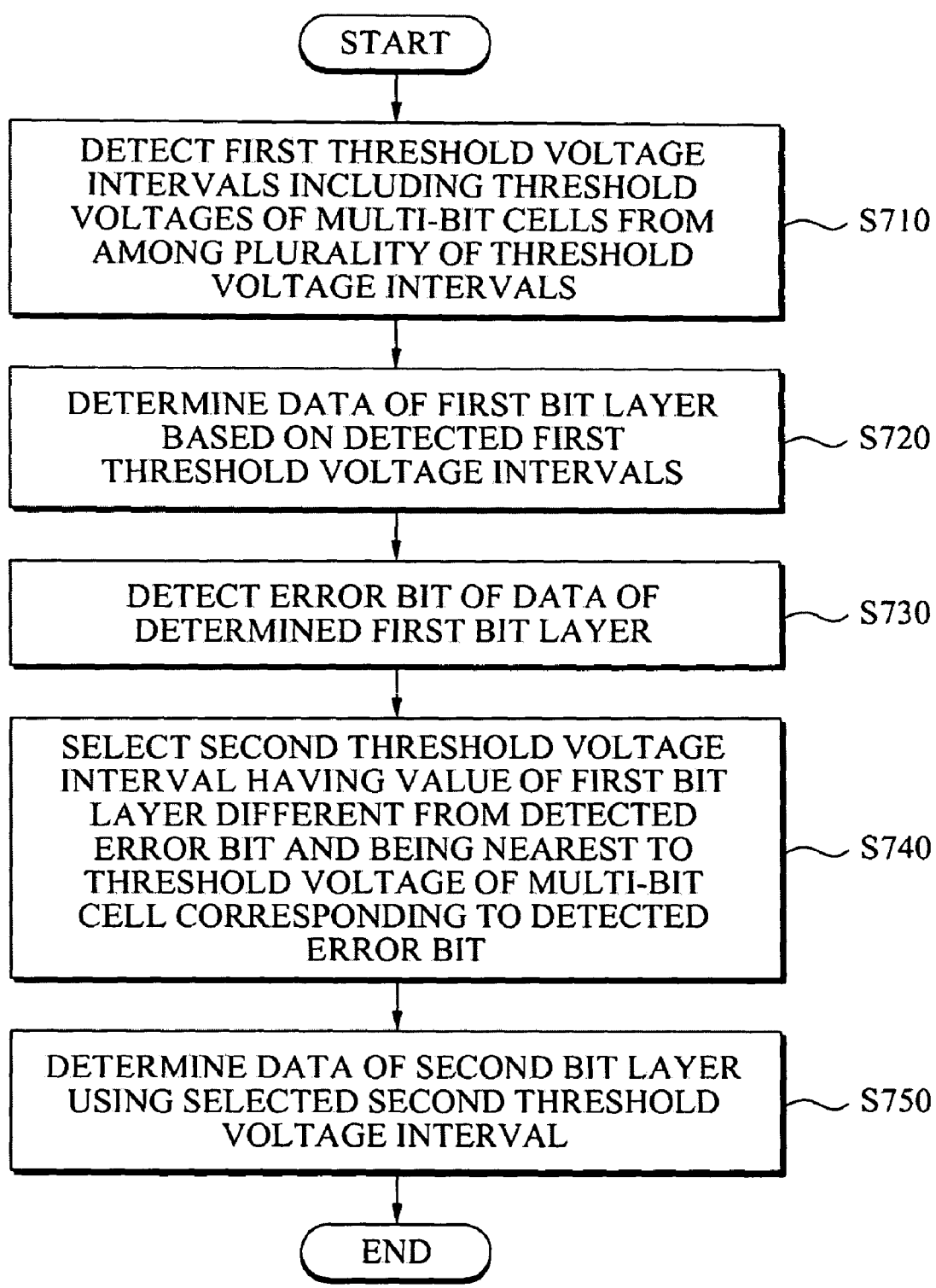
FIG. 7 is an operation flowchart illustrating a data reading method according to example embodiments.

FIG. 7 is an operation flowchart illustrating a data reading method according to example embodiments.

Referring to FIG. 7, in operation S710, the data reading method may include detecting first threshold voltage intervals including threshold voltages of multi-bit cells from among a plurality of threshold voltage intervals.

In operation S710, the data reading method may include detecting the first threshold voltage interval including a threshold voltage of each of the multi-bit cells. The data reading method may include detecting the first threshold voltage interval of each of the multi-bit cells in operation S710.

In operation S720, the data reading method may include determining data of a first bit layer based on the detected first threshold voltage intervals. In operation S720, the data reading method may include determining data of the first bit layer of each of the multi-bit cells based on the first threshold voltage interval of each of the multi-bit cells.

In operation S730, the data reading method may include detecting an error bit of the determined data of the first bit layer. In operation S730, the data reading method may include performing an ECC decoding on the determined data of the first bit layer in a code word unit having a certain length. In operation S730, the data reading method may include detecting the error bit of the determined data of the first bit layer while performing the ECC decoding.

In operation S740, the data reading method may include selecting a second threshold voltage interval which is the threshold voltage nearest to a threshold voltage of a multi-bit cell corresponding to the detected error bit that has values of the first bit layer different from the detected error bit. The data reading method may include identifying the multi-bit cell corresponding to the detected error bit. The data reading method may include selecting either threshold voltage intervals nearest to a threshold voltage of the identified multi-bit cell, or the second threshold voltage interval having the values of the first bit layer different from the detected error bit from among the threshold voltage intervals, which may also be viewed as the value of the first bit layer obtained by correcting the detected error bit. The data reading method may include selecting the second threshold voltage interval of the identified multi-bit cell.

In operation S750, the data reading method may include determining data of a second bit layer using the selected second threshold voltage interval. The data reading method may include determining the data of the second bit layer of the identified multi-bit cell using the selected second threshold voltage interval, and determining the data of the second bit layer of the remaining multi-bit cells using the first threshold voltage interval of the remaining multi-bit cells not including the identified multi-bit cell.

The data reading method may include setting a plurality of threshold voltage intervals such that consecutive odd numbers of threshold voltage intervals from among the plurality of threshold voltage intervals have asymmetrical values of the first bit layer.

The data reading method may include setting the plurality of threshold voltage intervals such that the plurality of threshold voltage intervals have values different from each other with respect to at least one of the remaining bit layers not including the second bit layer.

The data reading method may include correcting the detected error bit of the determined data of the first bit layer. In this instance, the data reading method may include correcting the detected error bit without performing an additional reading operation.

The data reading method may include determining data of the second bit layer without performing an additional reading operation in operation S750.

Figure 8:
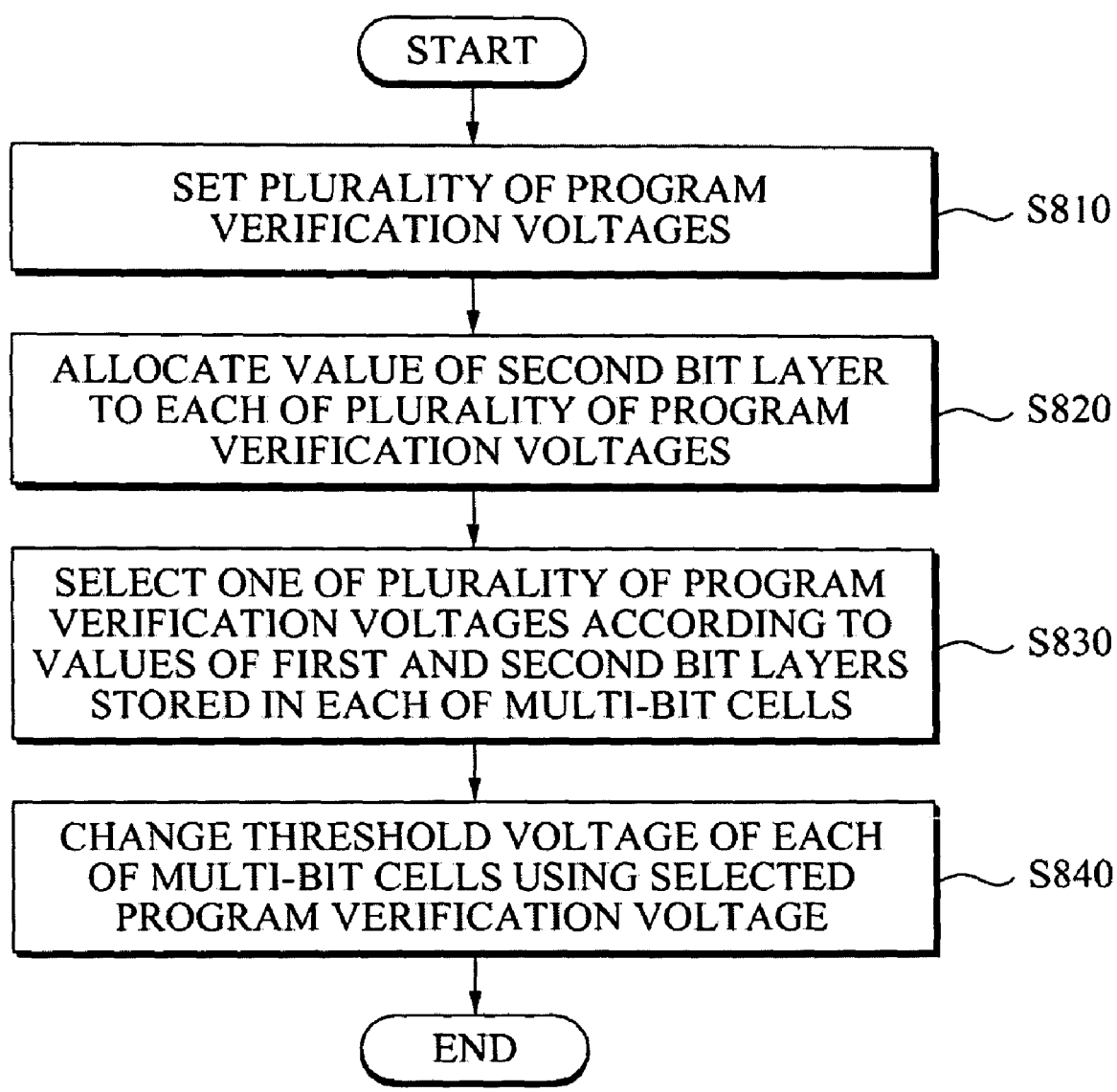
FIG. 8 is an operation flowchart illustrating a multi-bit programming method according to example embodiments.

FIG. 8 is an operation flowchart illustrating a multi-bit programming method according to example embodiments.

Referring to FIG. 8, in operation S810, the multi-bit programming method may include setting a plurality of program verification voltages. The multi-bit programming method may include setting the plurality of program verification voltages such that consecutive odd numbers of the program verification voltages from among the plurality of program verification voltages may have asymmetrical values of the first bit layer.

In operation S820, the multi-bit programming method may include assigning values of the second bit layer to each of the plurality of program verification voltages.

In operation S830, the multi-bit programming method may include selecting one of the plurality of program verification voltages according to the values of the first and second bit layers stored in each of the multi-bit cells. The multi-bit programming method may include selecting one program verification voltage to each of the multi-bit cells.

In operation S840, the multi-bit programming method may include changing a threshold voltage of each of the multi-bit cells using the selected program verification voltage.

In operation S810, the multi-bit programming method may include setting the plurality of program verification voltages such that adjacent program verification voltages from among the plurality of program verification voltages have values different from each other with respect to at least one of the remaining bit layers except the second bit layer.

The data reading method and/or the multi-bit programming method according to the above-described example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media may include magnetic media, for example hard disks, floppy disks, and magnetic tape; optical media, for example CD ROM disks and DVD; magneto-optical media, for example optical disks; and hardware devices that may be specially configured to store and perform program instructions, for example read-only memory (ROM), random access memory (RAM), flash memory, and the like. Examples of program instructions may include both machine code, for example produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers according to example embodiments may constitute memory cards. In this case, the memory controllers may be constructed to communicate with an external device for example, a host using any one of various types of protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices according to example embodiments may be non-volatile memory devices that can maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system according to example embodiments may include a microprocessor that is electrically connected with a bus, a user interface, a modem, for example a baseband chipset, a main controller, and a flash memory device. The flash memory device may store N-bit data via the main controller. The N-bit data may be processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The main controller and the flash memory device may constitute a solid state drive/disk (SSD) that uses a non-volatile memory to maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

The memory devices according to example embodiments may be applicable in a NAND flash, a NOR flash, an AND flash, and the like, and also applicable in storage devices having a multi-bit data storage unit.

The foregoing descriptions of example embodiments have been presented for purposes of illustration and description. They are not intended to be exhaustive or to limit example embodiments to the precise forms disclosed, and obviously many modifications and variations are possible in light of the above teaching. Therefore, it is intended that the scope of example embodiments be defined by the claims appended thereto and their equivalents.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device, comprising:
   a multi-bit cell array;
   a threshold voltage detecting unit configured to detect first threshold voltage intervals including threshold voltages of multi-bit cells of the multi-bit cell array from among a plurality of threshold voltage intervals;
   a determination unit configured to determine data of a first bit layer based on the detected first threshold voltage intervals; and
   an error detection unit configured to detect an error bit of the data of the first bit layer,
   wherein the determination unit determines data of a second bit layer using a second threshold voltage interval, the second threshold voltage interval being a threshold voltage interval, from among threshold voltage intervals having a value of the first bit layer different from the detected error bit, that is nearest to a threshold voltage of a multi-bit cell corresponding to the detected error bit.

2. The memory device of claim 1, wherein odd numbers of consecutive threshold voltage intervals from among the plurality of threshold voltage intervals have asymmetrical values of the first bit layer.

3. The memory device of claim 1, wherein threshold voltage intervals adjacent to each other from among the plurality of threshold voltage intervals have values of the first bit layer that are different from each other.

4. The memory device of claim 1, wherein
   the determination unit determines data of the first bit layer and data of a third bit layer based on the detected first threshold voltage intervals,
   the error detection unit detects an error bit of the data of the first bit layer and/or the third bit layer, and
   the second threshold voltage interval is a threshold voltage interval, from among the threshold voltage intervals that have a value of the first bit layer and/or the third bit layer different from the detected error bit with respect to either the first bit layer or the third bit layer, that is nearest to a threshold voltage of a multi-bit cell corresponding to the detected error bit with respect to either the first bit layer or the third bit layer.

5. The memory device of claim 4, wherein threshold voltage intervals adjacent to each other, from among the plurality of threshold voltage intervals, have values different from each other with respect to at least one of the first bit layer and the third bit layer.

6. The memory device of claim 4, wherein a number of transitions of values of the second bit layer of threshold voltage intervals adjacent to each other, from among the plurality of threshold voltage intervals, is greater than a number of transitions of values of the first bit layer of the adjacent threshold voltage intervals, and is also greater than a number of transitions of values of the third bit layer of the adjacent threshold voltage intervals.

7. The memory device of claim 1, wherein the determination unit performs a hard decision on the data of the first bit layer based on the detected first threshold voltage intervals, and also performs a hard decision on data of the second bit layer using the second threshold voltage interval.

8. The memory device of claim 1, wherein the error detection unit performs an Error Correction Codes (ECC) decoding on the data of the first bit layer to thereby detect the error bit of the data of the first bit layer.

9. A data reading method, comprising:
  detecting first threshold voltage intervals including threshold voltages of multi-bit cells from among a plurality of threshold voltage intervals;
  determining data of a first bit layer based on the detected first threshold voltage intervals;
  detecting an error bit of the determined data of the first bit layer;
  selecting a second threshold voltage interval, the second threshold voltage interval being a threshold voltage interval, from among threshold voltage intervals having a value of the first bit layer different from the detected error bit, that is nearest to a threshold voltage of a multi-bit cell corresponding to the detected error bit; and
  determining data of a second bit layer using the selected second threshold voltage interval.

10. The data reading method of claim 9, further comprising:
  setting the plurality of threshold voltage intervals such that odd numbers of consecutive threshold voltage intervals from among the plurality of threshold voltage intervals have asymmetrical values of the first bit layer.

11. The data reading method of claim 9, further comprising:
  setting the plurality of threshold voltage intervals such that threshold voltage intervals adjacent to each other from among the plurality of threshold voltage intervals have values different from each other with respect to at least one of bit layers other than the second bit layer.

12. The data reading method of claim 9, wherein the determining of the data of the second bit layer further comprises:
  determining a part of the data of the second bit layer using the selected second threshold voltage interval; and
  determining a remaining part of the data of the second bit layer from the detected first threshold voltage intervals.

13. The data reading method of claim 9, further comprising:
  correcting the detected error bit of the determined data of the first bit layer,
  wherein the correcting includes correcting the detected error bit without additionally reading.

14. The data reading method of claim 9, wherein the determining of the data of the econd bit layer includes determining the data of the second bit layer without additionally reading.

15. A computer-readable recording medium storing a program for implementing the method of claim 9.

* * * * *